United States Patent [19]

Mori et al.

[11] Patent Number: 4,785,188
[45] Date of Patent: Nov. 15, 1988

[54] PRIMARY PARTICLE BEAM IRRADIATION APPARATUS AND METHOD OF IRRADIATION THEREOF

[75] Inventors: Haruhisa Mori, Yokohama; Tadayuki Kojima, Kawasaki; Satoshi Hasui, Machida, all of Japan; Hiroshi Ohmori, Peabody, Mass.; Shuji Kikuchi, Kumamoto, Japan

[73] Assignees: Fujitsu Limited, Kanagawa; Tokyo Electron Limited, Tokyo, both of Japan

[21] Appl. No.: 102,448

[22] Filed: Sep. 29, 1987

[30] Foreign Application Priority Data

Sep. 30, 1986 [JP] Japan .................. 61-229969

[51] Int. Cl.[4] .......................... H01J 37/304
[52] U.S. Cl. .................. 250/492.2; 250/397; 250/398
[58] Field of Search ............ 250/492.21, 398, 397, 250/399, 491.1, 492.3; 219/121 EV

[56] References Cited

U.S. PATENT DOCUMENTS 3,585,397 6/1971 Brewer .................. 250/49.5
4,503,329 3/1985 Yamaguchi et al. ......... 250/492.21

FOREIGN PATENT DOCUMENTS 3517867 1/1986 Fed. Rep. of Germany .
55-124936 9/1980 Japan .
59-9843 1/1984 Japan .
61-39356 2/1986 Japan .

Primary Examiner—Bruce C. Anderson
Assistant Examiner—Jack I. Berman
Attorney, Agent, or Firm—Armstrong, Nikaido, Marmelstein & Kubovcik

[57] ABSTRACT

A primary particle beam irradiation apparatus comprising a stage on which a target is placed; a device for irradiating a predetermined scan region on the stage with a primary particle beam; a secondary ion sensor for detecting a secondary ion, generated by an irradiation of the primary particle beam, from the stage or the target; and a device, connected to the irradiating device and the secondary ion sensor, for controlling the irradiating means on the basis of an output signal from the secondary ion sensor.

Further, a method for irradation of a primary particle beam comprising the step of detecting the irradiation position of a primary particle beam scanned on a target over a predetermined width or predetermined region by using the output of a secondary ion sensor provided near the surface of the target; the step of correcting the deviation of the irradiation position based on the information of the irradiation position which is detected, and further scanning the primary particle beam to irradiate the surface of the target based on the information obtained at the correction step.

17 Claims, 7 Drawing Sheets

PRIMARY PARTICLE BEAM IRRADIATION APPARATUS AND METHOD OF IRRADIATION THEREOF

BACKGROUND OF THE INVENTION

1. Field of the Invention

The present invention relates to an apparatus for the irradiation of a primary particle beam and a method for irradiation of the same, more particularly, to an apparatus for the irradiation of a primary particle beam and a method for irradiation of the same wherein a primary particle beam such as an ion beam is irradiated on a target such as a semiconductor wafer placed on a rotating disk, with a certain width of scanning, for ion implantation etc.

2. Description of the Related Art

In general, when performing ion implantation on targets such as semiconductor wafers, for example, when controlling the threshold value Vth of a MOS transistor, the dosage of the ions to be implanted into the semiconductor wafers is low and the current of the ion beam, in accordance with that low dosage, is kept at a low current of from 0.1 microamperes to 1 or 2 microamperes, thereby reducing the amount of heat given to the wafers.

As opposed to this, when a source or drain region of a MOS transistor is formed, for example, the dosage of the ions to be implanted into the semiconductor wafers is high. Therefore, to give the same processability as with the above control of the Vth, from the viewpoint of the production of the integrated circuit, the current of the ion beam, in accordance with this high dosage, must be made a large one of about 10 milliamperes. As a result, the power, or heat, given to the wafers (expressed as the ion beam current × the ion beam acceleration voltage) reaches, for example, about 10 milliamperes × 200 kV = 2 kW.

Therefore, in the former implantation of ions (for the Vth control), the wafers are fixed in place and an ion beam of a certain strength is raster scanned on the wafers, whereby even if an ion beam of a certain strength is irradiated for each wafer by a single raster scanning, the amount of heat given to the wafers is small, so there is relatively less of a rise in the temperature and other problems are avoided.

However, in the latter implantation of ions (for the formation of source and drain regions) in the wafers, a plurality of wafers are arranged on the side of a rotating drum or on the surface of a rotating disk, an ion beam of a certain strength is scanned successively on the plurality of wafers so as to cover at least the wafer regions, and the scannings are repeated a plurality of times (for example, from a few times to about a 100 times, in accordance with the dosage), whereby the need arises to disperse the heat instantaneously given to the wafers.

In this case, compared with the case of use of the above rotating drum, use of the above rotating disk is better in that, due to the rotary mechanism, it is possible to improve the rotating speed of the disk and is easier by that much to disperse the power (heat) given to the wafers. Therefore, the larger the power to be given to the wafers, the more advantageous the use of a rotating disk.

That is, in this case, a plurality of wafers are arranged on the rotating disk along its circumferential direction and an ion beam of a certain strength is irradiated over the entire surfaces of the plurality of wafers by irradiating the ion beam reciprocatively across a certain distance (a distance slightly over the width of the diametric direction of the wafer) (therefore, due to the rotation of the disk, the ion beam follows a path like along the groove of a record to successively irradiate the plurality of wafers, whereby predetermined regions including the plurality of wafers are successively irradiated). The reciprocative irradiation of the ion beam (scanning) is repeated a plurality of times, as mentioned above, whereby the dosage of the ions implanted in the wafers becomes the predetermined high dosage. Note that in this case, instead of reciprocatively moving the ion beam a plurality of times by a predetermined width, as mentioned above, it is conceivable that the rotating disk be reciprocatively moved a plurality of times by the predetermined width. In general, however, the former technique enables high speed reciprocative movement and, therefore, usually the former means is adopted. Note that in reciprocatively moving the ion beam by the predetermined width, the ion beam is moved successively in steps with each predetermined width, that is, if the width of movement per step in the scanning is $\Delta W$, by steps with each ($\Delta W$).

However, in irradiating such an ion beam, differences arise in the area which is implanted, on the rotating disk, at the inner circumferential side and outer circumferential side of the irradiation regions including the plurality of wafers (in the radial direction of the disk). Therefore, wen the implantation time (residence time) of the ion beam at each step is made equal, the dosage of the ions at the inner circumferential side (per unit area) becomes larger than the dosage of ions at the outer circumferential side (per unit area), resulting in nonuniform dosages per unit area and making necessary changes in the speed of movement of the ion beam (in other words, residence time of the ion beam with each step). In this case, there would be no problem if the waveform of the scan signal for changing the irradiation position of the ion beam were changed synchronously to a predetermined waveform, in accordance with the change in the residence time, so as to make the dosage uniform over a predetermined width of irradiation region, but in actuality the magnitude (so-called "gain") and offset of the scan signal cause variations in the irradiation width of the ion beam and positional deviations in the irradiation range of the ion beam (over the predetermined width). Further, the nonlinearity of scan magnets etc. used for controlling the path of irradiation of the ion beam (for example, due to the shape of the magnet or the edging effect generated in the magnet) cause the magnetic field intensity of the scan magnets (that is, the position of irradiation of the ion beam) to fail to change linearly with respect to the scan signal, which in turn causes deviation of the irradiation width and irradiation range of the ion beam. Therefore, the uniformity of the dosage of the ion beam on the wafers deteriorates and, further, the reproducibility of the dosage on the wafers for different batches deteriorates.

In view of these problems, in the prior art, the difference in the implantation area in the radial direction of the disk and the nonlinearity of the scan magnets have been corrected by, for example, using test wafers and making a map of the ion implantation amount in the radial direction (for example, measuring this by the sheet resistance) and by using a predetermined scan signal programmed in advance based on the map to correct, by software, the magnetic field intensity or the amount of change of the magnetic field of the scan magnets.

However, even with this method, in actuality the irradiation position of the ion beam irradiated on the wafers (which strictly speaking differs with each operation of the apparatus, that is, with each batch) is not detected and, therefore, strictly speaking, it is not possible to sufficiently correct the nonuniformity of dosage arising from the differences in implantation area and nonlinearity of the scan magnets, which differ with each operation of the apparatus.

SUMMARY OF THE INVENTION

The present invention was made with a view to resolving the above problems and has as its object controlling the irradiation width and scan range (irradiation position in the radial direction) of the ion beam to a predetermined irradiation width and predetermined irradiation position with good accuracy with each operation of the apparatus, thereby improving the uniformity of the dosage of the ion beam on the wafers and the reproducibility of the dosage on the wafers with each batch.

To achieve the above object, according to one aspect of the present invention, there is provided a primary particle beam irradiation apparatus comprising a stage on which a target is placed; means for irradiating a predetermined scan region on the stage with a primary particle beam; a secondary ion sensor for detecting a secondary ion, generated by an irradiation of the primary particle beam, from the stage or the target; and means, connected to the irradiating means and the secondary ion sensor, for controlling the irradiating means on the basis of an output signal from the secondary ion sensor.

Further, according to another aspect of the present invention, there is provided a method for irradiation of a primary particle beam comprising the step of detecting the irradiation position of a primary particle beam scanned on a target over a predetermined width or predetermined region by using the output of a secondary ion sensor provided near the surface of the target; the step of correcting the deviation of the irradiation position based on the information of the irradiation position which is detected, and further scanning the primary particle beam to irradiate the surface of the target based on the information obtained at the correction step.

According to the above constitution of the present invention, a secondary ion sensor, which has directionality, is used to selectively detect the secondary ions generated due to the primary particle beam (generated due to reflectance of the primary particle beam or due to sputtering of the target material at the irradiation position by irradiation of the primary particle beam) irradiated on the portion of the target (disk or wafer) corresponding to the position at which the sensor is set. By this, it is continually detected if the correspondence between the scan signal for scanning the primary particle beam and the irradiation position of the primary particle beam is the desired correspondence. In accordance with the results of the detection, the scan system of the primary particle beam is controlled so as to make a predetermined correction (for example, adjustment is made of the scan signal preprogrammed for formation of the magnetic field of the scan magnets), whereby the scan width of the primary particle beam and the irradiation position of the primary particle beam in the radial direction are adjusted to a high precision and uniformity of the dosage with respect to the targets (wafers) and reproducibility of the dosages with respect to the wafers for each batch are ensured.

Further, according to the irradiation method of the present invention, the position of the primary particle beam irradiated (for example, ion implanted) on the target by the first scan is detected by the output of the secondary ion sensor. Based on the information of the irradiation position which is detected, the deviation of the irradiation position of the primary particle beam is detected. Based on this detected information, the scan signal is corrected and this used for the second irradiation of the primary particle beam on the target. The same steps are repeated a predetermined number of times. In this case, the detection of the previous irradiation position performed before each irradiation step and the correction of the deviation thereof may be performed each time up until the final scan or may be repeated a predetermined number of times first and subsequently the detection and correction omitted and the irradiation continuously repeated. This may be arbitrarily selected.

Note that the present invention may present additional means used after the software correction of the prior art described above so as to make the correction more precise.

DESCRIPTION OF THE PREFERRED EMBODIMENTS

Figure 1A:
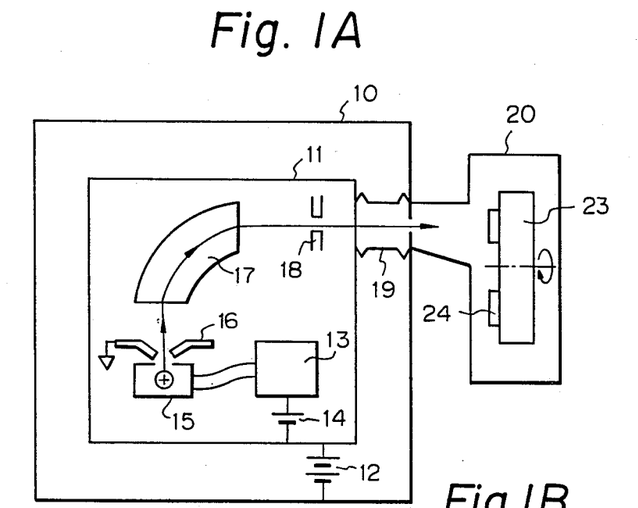
FIG. 1A and FIG. 1B are views of examples of the constitution of a primary particle beam irradiation apparatus of the prior art.

To clarify the present invention, an explanation will first be made of a primary particle beam irradiation apparatus using a rotating disk in the prior art. FIG. 1A shows an example of the overall constitution of the primary particle beam irradiation apparatus in the prior art, wherein 10 and 11 represent outside and inside housings formed one in another, the housings 10 and 11 having connected therebetween a direct current power supply 12 for ion acceleration (for example, adjusted to a range of from 0 V to 120 kV to 175 kV). Reference numeral 15 is an ion generation source (plasma generation apparatus), which ion generation source 15 has connected thereto a power supply apparatus 13 for generating plasma. The housing of the power supply apparatus 13 and the inside housing 11 have connected therebetween, for example, a 25 to 80 kV direct current power supply 14. Reference numeral 16 is an electrode for taking out ions and is, for example, set to the same potential as the housing 11. By this, a strong electric field is generated, using the direct current power supply 14, between the ion generation source 15 and the extraction electrode 16. As a result, the beam of plasma ions generated at the ion generation source 15 is extracted through the extraction electrode 16, passed through the gap between a pair of arc-shaped magnets 17 disposed opposing each other in the up and down direction with respect to the drawing (in FIG. 1A, only one is shown), and bent in the direction of advance of the ion beam by the action of the magnetic field formed in that gap. In this case, depending on the type of element comprising the ion beam (that is, the weight of the ions), the degree of bending differs (the lighter the ion, the greater the bend), so only an ion beam corresponding to the desired element passes through the predetermined path of advance to pass through a slit 18, is accelerated by the strong electric field produced by the direct current power supply 12 in an accelerator tube 19 provided between the double housings 10 and 11, and is irradiated toward the predetermined target (for example, semiconductor wafers 24 placed on the rotating disk 23 in a box housing 20. Note that the housing 20, the accelerator tube 19, and the housing 11 in which the path of the ion beam is formed are formed as a vacuum container.

Figure 1B:
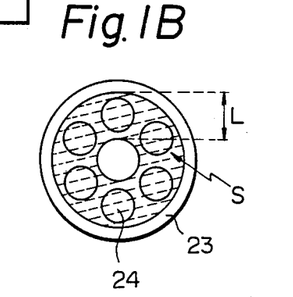

In this case, for the ion beam to be irradiated over the entire surface of the plurality of wafers 24 (see FIG. 1B) placed on the rotating disk 23 in the circumferential direction, the ion beam must be irradiated over a predetermined width (for example, a width L including the semiconductor wafers 24 and slightly larger than the width of the semiconductor wafers 24, as shown in FIG. 1B) (therefore, due to the rotation of the disk 23, the irradiation region becomes the region S shown by the broken slanted lines in FIG. 1B). As a means for this, consideration may be given to (1) moving the rotating disk 23 reciprocatively by the predetermined width L or (2) repeatedly scanning the ion beam over the target so as to cause the ion beam to reciprocatively moved by the predetermined width L. In this case, the latter (2) enables the scanning at a high speed.

Figure 2:
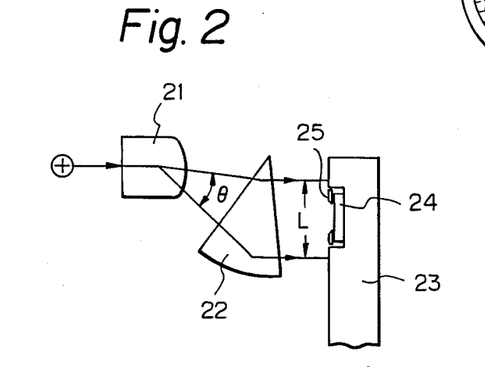
FIG. 2 is a view showing in detail the internal constitution after the acceleration tube in FIG. 1.

FIG. 2 shows an example of a concrete constitution for the above scanning when an ion beam is irradiated over a target after passing through the accelerator tube 19, in the case of using the means of the latter (2) for scanning of the ion beam. In the figure, 21 shows scan magnets for making the ion beam move reciprocatively and cyclically over a predetermined range of angle $\theta$ and 22 shows magnets for making an ion beam which has become bent in its direction of advance due to the scan magnets 21, as mentioned above, parallel with a certain direction (and thereby making the ion beam move reciprocatively on the rotating disk 23 in a range of a predetermined scan width L including the region of the wafers 24 mounted on the disk 23 by rings 25). Here, the magnets 21 and 22, like the magnets 17, comprise pairs of magnets which oppose each other in the up and down direction with respect to FIG. 2, for example.

The magnets 21 are excited by a predetermined scan signal for a cyclic change of the intensity of the magnetic field created in the gap between the pair of magnets (through which gap the ion beam passes). By this, the ion beam is scanned repeatedly over the predetermined range of angle $\theta$. The magnets 22 are fixed in the intensity of the magnetic field created in the gap between the pair of magnets. As mentioned above, by using the above magnets 21, the ion beam is bent to various angles so as to move reciprocatively over a predetermined range of angle $\theta$. Further, in the example of FIG. 2, the beams are directed to the original direction by making the direction of the magnetic field created in the gap between the magnets 22 opposite to the direction of the magnetic field created in the gap between the magnets 21. Further, the further downward, as shown in FIG. 2, the greater the width of the shape of the magnets 22 that is formed, for example, a triangular shape is used as the magnets 22. As a result, all the ion beams which are bent are made oriented in parallel in a predetermined direction.

Figure 3:
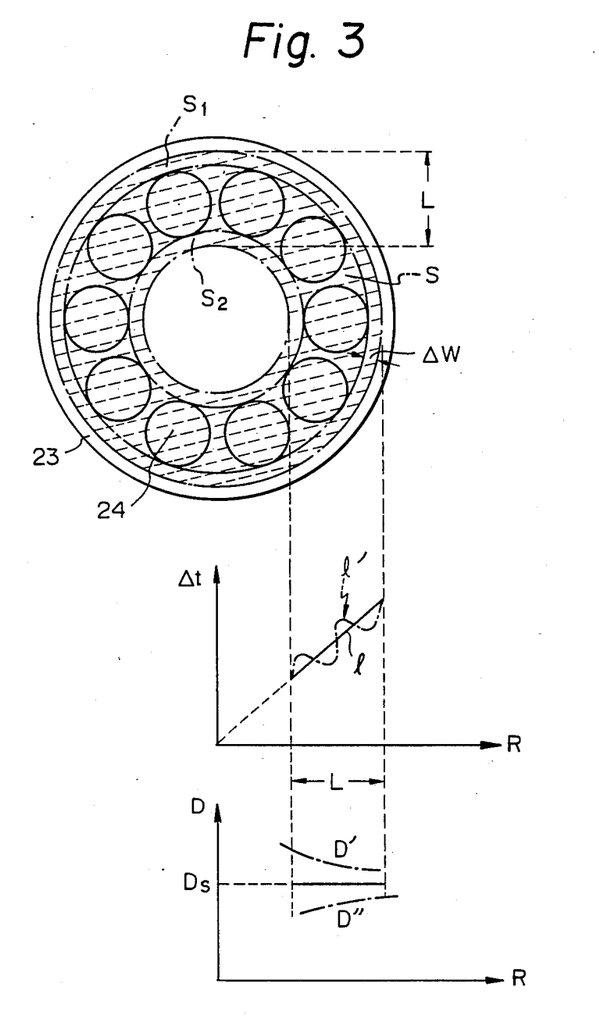
FIG. 3 is a view for explaining the speed of movement of the primary particle beam in the case of scanning and irradiation of the primary particle beam on a plurality of wafers placed on a rotating disk.

FIG. 3 is a view for explaining the speed of movement of an ion beam (in the radial direction of the rotating disk) in the case of irradiation of the ion beam over a predetermined width L (therefore, the irradiation region becomes the region S shown by the broken slanted lines as mentioned above) so as to irradiate the ion beam over the entire surface of a plurality of wafers 24 placed on the above rotating disk 23 along the circumferential direction (in this case, 10 wafers 24). Here, in reciprocatively moving the ion beam over the radial direction of the rotating disk, as mentioned above, the ion beam is made to successively move in steps with each predetermined width $\Delta W$.

When the ion beam is made to move reciprocatively over the radial direction of the rotating disk in this way, a difference is created in the area implanted between the inner circumferential side and outer circumferential side of the irradiation region, as mentioned above. For example, the area of the innermost circumferential band shaped region S2 will be expressed as the product of the circumferential length of the region S2 and the width of movement $\Delta W$ per step, while the area of the outermost circumferential band shaped region S1 will be expressed as the product of the circumferential length of the region S1 and the width of movement $\Delta W$. That is, when the ion beam moves in steps on the band shaped regions, the dosage D of the ion beam per unit area in the band shaped regions will be expressed by the following formula:

$$\frac{D}{n} = \frac{I_B \cdot \Delta t/q}{\Delta W \cdot 2\pi R}$$

where, n is the number of reciprocative motions $I_B$ is the current of the ion beam $\Delta t$ is the residence time of the ion beam on the band shaped regions q is the ion charge $\Delta W$ is the width of movement of the ion beam per step R is the radius of the band shaped regions Therefore, to make the dosage D in the band shaped regions uniform (in FIG. 3, to make the dosage to be inherently implanted Ds), it is necessary to increase the residence time $\Delta t$ as shown by the line 1 in FIG. 3 to be proportional to the radius R of the band shaped regions. In this case, as mentioned above, there would be no problem if, as mentioned above, the waveform of the scan signal were changed so as to become a predetermined waveform in accordance with changes of the residence time $\Delta t$ and the dosage over the irradiation region of the predetermined width L were made uniform as shown by Ds in FIG. 3, but in actuality the gain and offset of the scan signal cause changes in the irradiation width L of the ion beam and cause deviation in the position of the actual irradiation range in the radial direction.

Therefore, for example, when the actual irradiation range deviates to the center of the rotating disk, the residence time $\Delta t$ at the predetermined position increases in accordance with the deviation and, as a result, the dosage in the radial direction of the rotating disk changes as shown by D' in FIG. 3. On the other hand, when the actual irradiation range deviates in the outward direction of the rotating disk, conversely, the dosage in the radial direction of the rotating disk changes as shown by D'' in FIG. 3.

Further, nonlinearity of the scan magnets which scan the ion beam, etc., as mentioned above, can become the cause of failure of the magnetic field intensity of the scan magnets to change linearly with respect to the scan signal. As a result, the residence time $\Delta t$ will not change linearly as mentioned above with respect to the radius R. The residence time will change to a waveform with respect to the radius R as shown by the curved line l' in FIG. 3. This too will cause deviation of the dosage in the radial direction. For this reason, there will be the problem or poor uniformity and reproducibility of the dosage of the ion beam with respect to wafers in different batches, as mentioned above.

Figure 4:
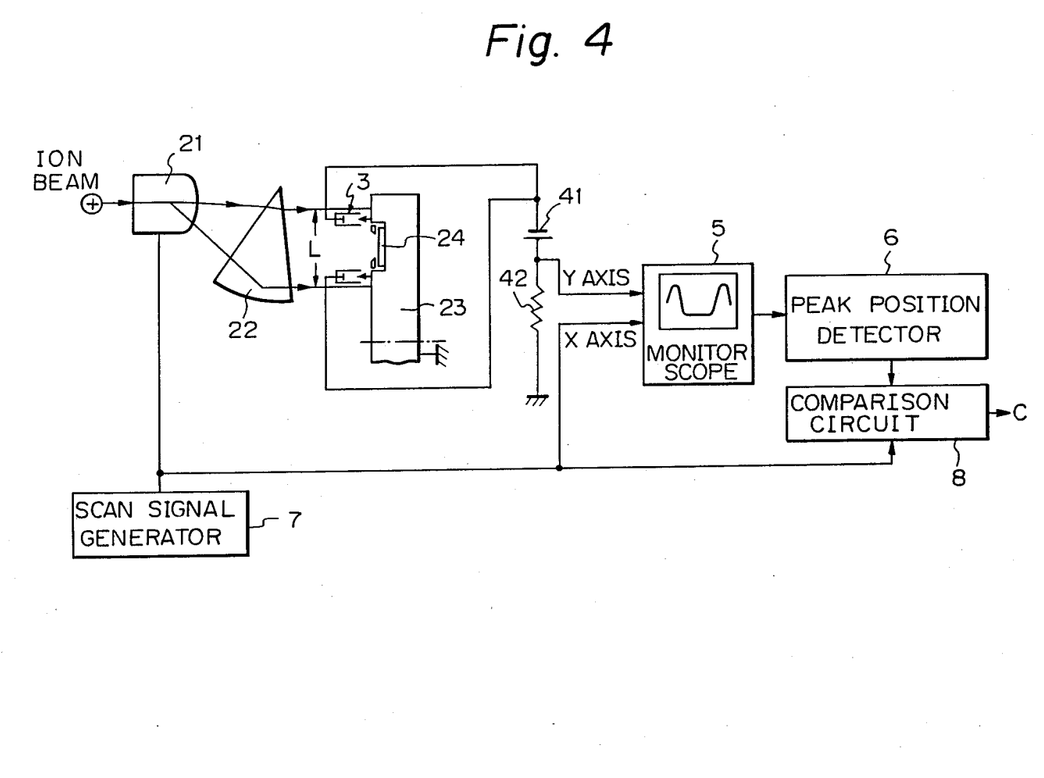
FIG. 4 is a view of the constitution of a primary particle beam irradiation apparatus according to a first embodiment of the present invention.

The present invention was made so as to resolve the above problems. FIG. 4 shows the constitution of a primary particle beam irradiation apparatus according to a first embodiment of the present invention. As shown in FIG. 4, an ion beam accelerated by the accelerator tube passes between scan magnets 21 and the correction magnets 22 arranged thereafter to be irradiated over a predetermined region on a disk 23 including wafers 24. Note that the scan magnets 21 are excited by a preprogrammed scan signal supplied from a scan signal generator 7 to form a predetermined magnetic field for scanning.

Figure 5:
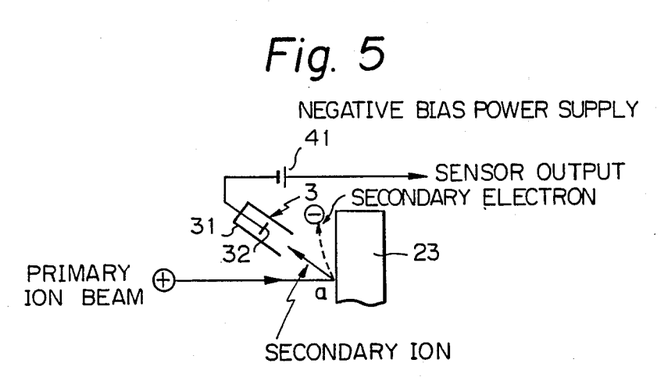
FIG. 5 is a side view of the constitution near the secondary ion sensor in FIG. 4.

Reference numeral 3 is a secondary ion sensor having directionality. In the embodiment shown in FIG. 4, two are provided: one each at the portions of the disk 23 adjoining the ends of the wafer 24 (therefore, near end portions of the irradiation region having a predetermined width L). In summary, as the secondary ion sensors, sensor electrodes may be arranged near the irradiation position to be detected. As the sensor electrodes, use may be made of simple metal pieces or as shown in FIG. 5, electrodes 32 provided in predetermined cylindrical covers 31, the electrodes 32 being insulated from the covers 31 (for example, by making the covers 31 of glass). The covers 31 may be arranged slanted as shown in FIG. 5 and seen from the side. Note that FIG. 4 is a view seen from the top.

When the ion beam (primary ion beam) is irradiated on a predetermined target (predetermined disk region including wafers 24), so-called secondary particles are generated from the target portion irradiated. Here, secondary particles include secondary ions and also secondary electrons, and photons. In the present invention, however, secondary ions generated from the irradiated target portion are detected.

Figure 6:
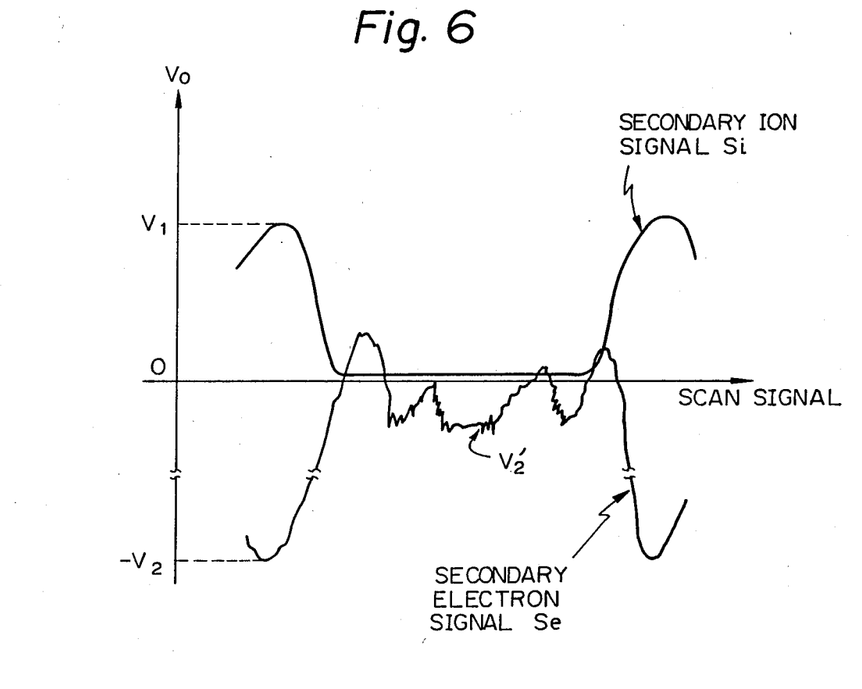
FIG. 6 is a view for comparing and explaining the case of use of a secondary ion signal as the signal formed by the secondary particles and the case of use of a secondary electron signal.

The reason for this is that, as shown by FIG. 6, when secondary electrons are detected, the peak value $V_2$ of the secondary electron signal Se (due to secondary electrons generated from target portion near position of installation of sensor) becomes far greater in the signal intensity than the peak value $V_1$ of the secondary ion signal Si in the case of detection of secondary ions (for example, positive ions) (in FIG. 6, although the ratio of intensity is not shown accurately, the ratio between $V_2$ and $V_1$ is usually in the order of 10:1). However, a secondary electron signal has mixed therein, between the peak values of the two sides corresponding to the two sensors provided at the two ends of the target, a noise signal $V_2'$ of a value of a certain fraction of the peak values. As a result, a flat, stable signal cannot be obtained other than at the peak values as in the case of the secondary ion signal and there is a chance of error in the detection position. Note that the secondary ions include those which arise by reflectance of irradiated primary ions at the target portion and those which arise due to sputtering of the target material at the irradiation position. Note further that the target material which was sputtered includes the disk material at the irradiation position (for example, aluminum) and the wafer material (for example, silicon), which differs depending on the position at which the secondary ion sensors are provided.

Here, the electrode 32, which is negatively biased with a battery or an isolated power supply 41 with respect to the target provided in the secondary ion sensor 3 receives the influx of only positive secondary ions generated from the target portion (see reference symbol "a" in FIG. 5) corresponding to the position at which the secondary ion sensor 3 is provided (that is, has directionality). In other words, the secondary ion sensor 3 takes in only the secondary ions created by the irradiation of the primary ion beam on the above target portion "a" and thus has so-called directionality.

The charges of the secondary ions (in this case, positive ions) taken into the electrode 32 of the secondary ion sensor 3 in this way flow to the ground side through a bias power supply 41 and resistor 42 based on the bias voltage from the bias power supply 41 (for example, which applies a negative bias voltage of $-10$ V to $-100$ V to the electrode 32) and create a voltage drop proportional to the amount of secondary ions taken in at the two ends of the resistor 42. Note that the disk 23 is usually made the ground potential.

Figure 7:
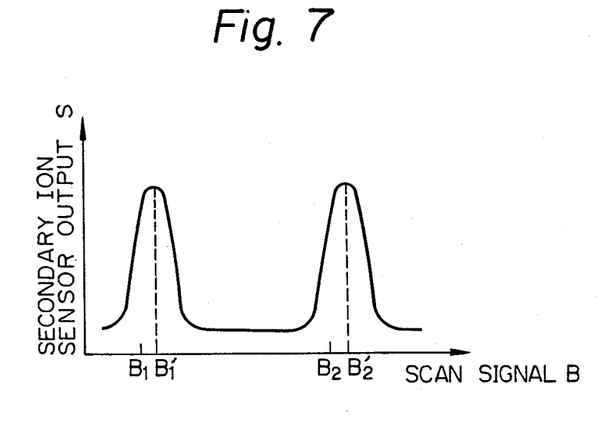
FIG. 7 is a view for explaining an example of an image on a monitor scope in FIG. 4.

Reference numeral 5 is a monitor scope which receives as its X-axis input the above-mentioned scan signal from the scan signal generator 7 and as its Y-axis input the potential $V_0$ of the connection point between the bias power supply 41 and the resistor 42. Therefore, the monitor scope 5, as shown in FIG. 7, draws an image having the value of the scan signal B exciting the scan magnets 21 as its horizontal axis (in accordance with changes in the scan signal, the magnetic field intensity of the scan magnets 21 changes and the irradiation position of the ion beam changes) and the secondary ion sensor output S corresponding to the values of the scan signal B as the vertical axis. In other words, the image of FIG. 7 shows that peaks are created at the output S of the secondary ion sensor when the value of the scan signal is $B_1'$ and $B_2'$ (that is, the ion beam is irradiated at a target portion "a" corresponding to the installation position of the secondary ion sensor 3 and the secondary ions taken in to the secondary ion sensor 3 become the peak). Reference numeral 6 shows a peak position detector which detects the values $B_1'$ and $B_2'$ of the scan signals corresponding to the peak positions. Further, 8 is a comparison circuit which finds the scan signal values $B_1'$ and $B_2'$ from the value of the scan signal supplied from the scan signal generator 7 and compares them with the ideal values $B_1$ and $B_2$ to determine at all times if $B_1'$ and $B_2'$ coincide with the values $B_1$ and $B_2$ of the scan signal for which the output of the secondary ion sensor 3 will inherently become a peak (that is, the values of the scan signal to irradiate the target portion corresponding to the installation position of the secondary ion sensor). When noncoincidence of the same is determined by the output C from the comparison circuit 8, the scan system is made to be interlocked or the value of the scan signal output from the scan signal generator 7 is adjusted by a predetermined feedback means until coincidence to correct the deviation of the scan width or the scan position. For example, as shown in FIG. 7, while the value of the scan signal corresponding to the peak positions are $B_1'$ and $B_2'$, if the scan signal value for which the output of the secondary ion sensor would inherently become the peak are $B_1$ and $B_2$, the values $B_1$ and $B_2$ of the scan signal output from the scan signal generator 7 are increased and corrected to coincide with the above $B_1'$ and $B_2'$.

Figure 8:
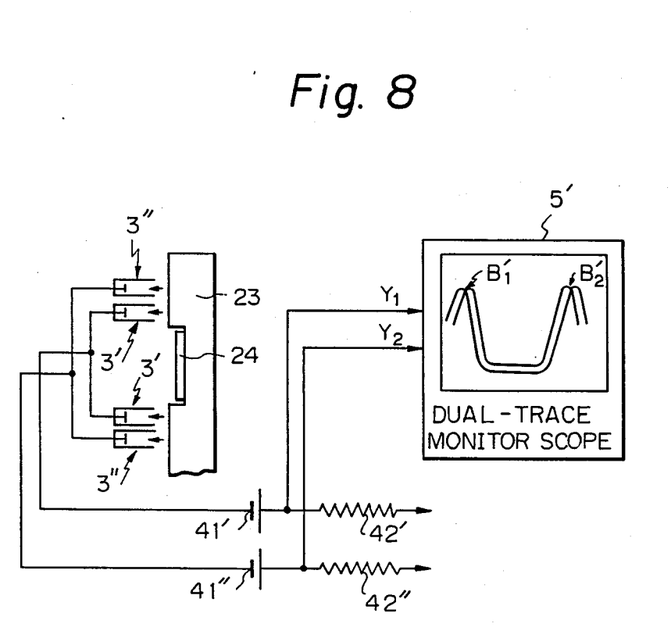
FIG. 8 is a view of the constitution of portions different from the apparatus of FIG. 4 in a primary particle beam irradiation apparatus according to another embodiment of the present invention.

In the embodiment shown in the above FIG. 4, there are a total of two secondary ion sensors 3 provided: one each near the ends of a predetermined scan region width. The number of sensors installed, however, is not particularly limited. For example, it is also possible to provide one near just one side of the scan region. Further, in the embodiment shown in FIG. 8, two secondary ion sensors 3' and 3" are provided near the two ends of the scan region along the scan direction of the ion beam separated by about the beam diameter, for example. The secondary ion output detected by the inside secondary ion sensors 3' and the outside secondary ion sensors 3" near the above-mentioned two ends pass, in the same way as above, through a circuit comprised of the bias power supply 41' and resistor 42' and circuit comprised of the bias power supply 41" and resistor 42", respectively, and are supplied as $Y_1$ axis input and $Y_2$ axis input of the dual-trace monitor scope 5'. As the X-axis input of the dual-trace monitor scope 5', in the same way as the embodiment of FIG. 4, the scan signal output from the scan signal generator 7 at this time is supplied. In this way, the dual-trace monitor scope 5' draws two mutually approaching waveforms with the outputs of the secondary ion sensors 3' and 3" as the vertical axes and the value of the scan signal B as the horizontal axis. Therefore, when the values of the scan signals make the outputs of the secondary ion sensors $B_1'$ and $B_2'$ corresponding to the intersections of the peak portions of the two waveforms, it is judged that the ion beam is irradiating at position between the two secondary ion sensors 3' and 3" disposed near the ends of the scan region. The same correction as above may be performed and, by detection of the intersections, the detection of the peak positions can be performed more accurately.

Further, by arranging a plurality of secondary ion sensors linearly or planarly in the scan region and monitoring the outputs of the secondary ion sensors by a predetermined monitor device (for example, a monitor circuit such as shown in the above-mentioned embodiment or simple comparison circuit), it is possible to successively detect the irradiation position of the ion beam and simultaneously detect the distribution of intensity of the ion beam for further high accuracy.

In the above embodiments, the explanation was made of the case where the primary particle beam irradiated on the target was an ion beam, but the primary particle beam covered by the present invention may also be a neutral beam. In this case, the neutral beam may be made neutral by a means which passes an ion beam scanned as mentioned above through, for example, a free floating gas. When the neutral beam resulting from this is irradiated on a predetermined target, the secondary ions generated at the irradiated target portion may be detected by the secondary ion sensor 3 to enable detection of the irradiation position of the neutral beam in the same way as with the above embodiments. Further, the amount of the neutral beam may be detected electrically by the output of the secondary ion sensor. Predetermined correction may be made with respect to the irradiation position and beam amount.

Figure 9:
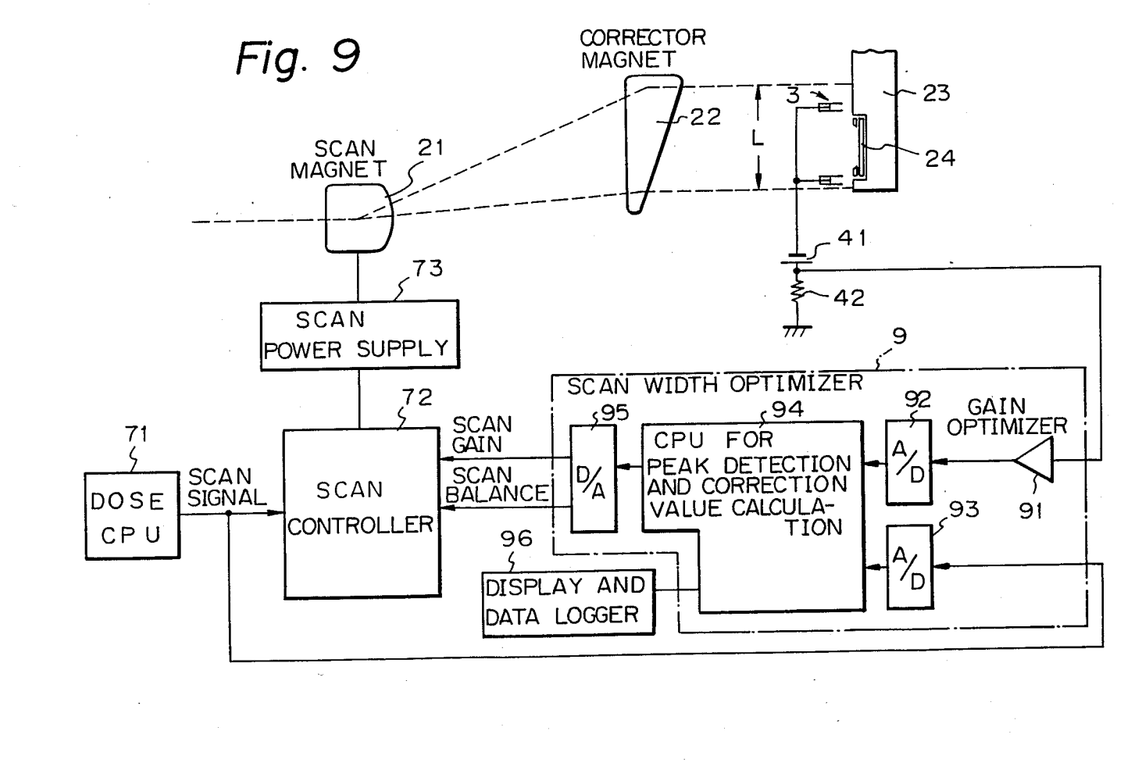
FIG. 9 is a view showing an example of the detailed constitution in the case of control of a scan signal using a computer, based on detection information of a secondary ion sensor.

FIG. 9 shows an example of a detailed construction in the case of control of the value of the scan signal using a computer based on information detected by the secondary ion sensors. Portions corresponding to those in FIG. 4 are given the same reference numerals.

The analog signal output from the secondary ion sensor is supplied from the connection point between the bias power supply 41 and resistor 42 connected at the output side of the sensors, through the gain optimizer 91 and first A/D converter 92, to the CPU 94 provided at the scan width optimizer 9. Further, the scan signal output from the dose CPU 71 (corresponding to above scan signal generator 7) is input through a second A/D converter 93 to the above CPU 94 in the same way. Note that in the above gain optimizer 91, the gain is set so that the peak value of the potential taken out from the connection point between the bias power supply 41 and the resistor 42 (changing by the intensity of the primary ion beam in accordance with the dosage) becomes a predetermined value suitable as an input for the A/D converter 92.

The digital signals output from the A/D converters 92 and 93 are input to the CPU 94. The CPU 94 detects the value of the scan signals corresponding to the peak outputs of the secondary ion sensors, calculates the correction value (that is, the deviation of the irradiation position of the primary ion beam), and converts the deviation in position to the gain and offset of the scan signal (respectively expressing the gradient and the deviation from the origin of the line showing the relationship between the scan signal voltage V and the residence time $\Delta t$). The thus calculated correction signals are input, respectively through a D/A converter 95 to the scan controller 72 as the scan gain signal, corresponding to the gain, and the scan balance signal, corresponding to the offset. By this, the gain and offset of the scan signal input from the dose CPU 71 to the controller 72 are corrected by the scan gain signal and scan balance signal. The corrected scan signal is made the predetermined scan signal current through the scan power supply 73 and supplied to the scan magnets 21. Note that the correction amounts (gain and offset) of the deviation of the irradiation position calculated in the CPU 94 are displayed upon need or recorded by a data logger (see 96).

Next, an explanation will be given of the process in the case of actual ion implantation by scanning and irradiation of an ion beam on semiconductor wafers placed on a rotating disk using the primary particle beam irradiation apparatus.

In this case, first, the irradiation position of the primary particle beam irradiated (ion implanted) on the target by the first scan is detected by the output of the secondary ion sensor. Based on the detected information on the irradiation position, the deviation of the irradiation position of the primary particle beam is corrected. By the second scan in which the scan signal is corrected in accordance with the above deviation, the second irradiation (ion implantation) of the primary particle beam on the target is performed, and at the same time, second data of the position deviation is obtained and corrected before the third scan. This same step is repeated a predetermined number of times.

In this case, the reason why the detection and correction step is not performed only once is that there is a danger of making corrections of the scan signal based on errors arising in the measurement system. For this reason, for safety considerations, correction of the scan signal is performed in each irradiation step at least during the initial few irradiations (ion implantations).

In this case, it is also possible to suitably choose between repetition of detection of the deviation of the previous irradiation position and the accompanying correction of the scan signal performed before each irradiation step, each time until the final irradiation or repetition of the detection and correction for just a predetermined few times in the initial period and then repeating the irradiation (ion implantation) consecutively without such detection and correction.

According to the present invention, it is possible to correct the scan system to a continually high precision so as to obtain the desired scan width and scan range (irradiation position) of the primary particle beam on the target. Further, it is possible to remarkably improve the uniformity and reproducibility of the dosage with respect to different targets (wafers).

We claim:

1. A primary particle beam irradiation apparatus comprising:
   a stage on which a target is placed;
   means for irradiating a predetermined scan region on the stage with a primary particle beam;
   a secondary ion sensor which selectively detects secondary ions generated at a predetermined irradiation position of said primary particle beam on said stage or the target; and
   means, connected to said irradiating means and said secondary ion sensor, for controlling said irradiating means on the basis of an output signal from said secondary ion sensor.

2. A primary particle beam irradiation apparatus according to claim 1, wherein the primary particle beam is an ion beam.

3. A primary particle beam irradiation apparatus according to claim 1, wherein the primary particle beam is a neutral beam.

4. A primary particle beam irradiation apparatus according to claim 1, wherein the target is a plurality of semiconductor wafers arranged on a rotating disk along the circumferential direction, the primary particle beam is scanned over a predetermined width including a width of said wafer in the radial direction of the rotating disk, and the secondary ion sensor is provided near one end or two ends of the region of the predetermined width.

5. A primary particle beam irradiation apparatus according to claim 1, wherein said secondary ion sensor is provided with an electrode given a bias potential for flow of the secondary ions.

6. A primary particle beam irradiation apparatus according to claim 1, wherein said stage comprises a rotating disk on which a plurality of targets are placed, said primary particle beam moving in the radial direction of said rotating disk.

7. A primary particle beam irradiation apparatus according to claim 1, wherein said secondary ion sensor is arranged so as to generate the maximum output when said beam irradiates a predetermined position on said stage.

8. A primary particle beam irradiation apparatus according to claim 1, wherein said controlling means corrects the irradiation position on the basis of the output from said secondary ion sensor.

9. A primary particle beam irradiation apparatus according to claim 1, wherein said secondary ion sensor comprises two sensor elements, each of said sensor elements being arranged at the position corresponding to each edge of said predetermined scan region, respectively.

10. A primary particle beam irradiation apparatus according to claim 1, wherein said controlling means comprises a peak position detector for detecting the peak of the output from said secondary ion sensor and a comparison circuit for comparing the output from said peak position detector with a reference signal, said irradiating means being controlled on the basis of the output from said comparison circuit.

11. A method for irradiation of a primary particle beam comprising the step of: detecting the irradiation position of a primary particle beam scanned on a target over a predetermined width or predetermined region by using the output of a secondary ion sensor provided near the surface of the target for selectively detecting secondary ions generated at a predetermined irradiation position of said primary particle beam; the step of correcting the deviation of the irradiation position based on the information of the irradiation position which is detected, and further scanning the primary particle beam to irradiate the surface of the target based on the information obtained at the correction step.

12. A method for irradiation of a primary particle beam according to claim 11, wherein the detection step and correction step are repeated with each irradiation step until the last step.

13. A method for irradiation of a primary particle beam according to claim 11, wherein the detection step and correction step performed before the irradiation step are repeated for just a predetermined few times at an initial period and then the irradiation steps are continuously repeated.

14. A method for irradiation of a primary particle beam according to claim 11, wherein the primary particle beam is an ion beam.

15. A method for irradiation of a primary particle beam according to claim 11, wherein the primary particle beam is neutral beam.

16. A method for irradiation of a primary particle beam according to claim 11, wherein the target is a plurality of semiconductor wafers arranged on a rotating disk along the circumferential direction, the primary particle beam is scanned over a predetermined width including a width of said wafer in the radial direction of the rotating disk, and the secondary ion sensor is provided near one end or two ends of the region of the predetermined width.

17. A method for irradiation of a primary particle beam according to claim 11, wherein said secondary ion sensor is provided with an electrode given a bias potential for flow of the secondary ions.

* * * * *